United States Patent [19]

Hashimoto

[11] Patent Number: 5,021,845

[45] Date of Patent: Jun. 4, 1991

[54] SEMICONDUCTOR DEVICE AND PROCESS FABRICATION THEREOF

[75] Inventor: Masashi Hashimoto, Ibaragi, Japan

[73] Assignee: Texas Instruments Incorporated, Dallas, Tex.

[21] Appl. No.: 547,529

[22] Filed: Jun. 29, 1990

Related U.S. Application Data

[63] Continuation of Ser. No. 339,937, Apr. 18, 1989, abandoned, which is a continuation of Ser. No. 259,487, Oct. 18, 1988, abandoned, which is a continuation of Ser. No. 901,091, Aug. 27, 1986, abandoned.

[30] Foreign Application Priority Data

Aug. 30, 1985 [JP] Japan ......................... 60-192395

[51] Int. Cl.⁵ ................... H01L 29/10; H01L 29/06; H01L 27/01
[52] U.S. Cl. .............................. 357/23.4; 357/23.1; 357/23.3; 357/23.12; 357/41; 357/55; 357/90
[58] Field of Search ............... 357/23.4, 23.3, 23.12, 357/90, 41, 55, 23.6, 23.1

[56] References Cited

U.S. PATENT DOCUMENTS

| | | | |
|---|---|---|---|
| 3,924,265 | 12/1975 | Rodgers | 357/41 |
| 4,003,036 | 1/1977 | Jenne | 357/23.4 |
| 4,112,455 | 9/1978 | Seliger et al. | 357/90 |
| 4,198,252 | 4/1980 | Hsu | 357/23.5 |
| 4,233,617 | 11/1980 | Klaassen et al. | 357/23.4 |
| 4,268,846 | 5/1981 | Spellman et al. | 357/38 |
| 4,316,203 | 2/1982 | Tohgei | 357/23.4 |
| 4,644,386 | 2/1987 | Nishizawa et al. | 357/23.6 |
| 4,786,953 | 11/1988 | Morie et al. | 357/55 |

FOREIGN PATENT DOCUMENTS 56-83973 7/1981 Japan .................. 357/23.12
56-115570 9/1981 Japan .................. 357/23 D

OTHER PUBLICATIONS

A Trench Mosfet with Surface Source/Drain Contacts, by Shigeru Nakajima, Kenji Miura, Toshifumi Somatani and Eisuke Arai, May 1985, IEDM Publication, pp. 200–203.

*Primary Examiner*—Andrew J. James
*Assistant Examiner*—Ngan Van Ngo
*Attorney, Agent, or Firm*—William E. Hiller; N. Rhys Merrett; Melvin Sharp

[57] ABSTRACT

An insulated-gate field-effect transistor device characterized by the channel region consisting of the intermediate heavily doped portion (50; 72) and two lightly doped portions (46, 48; 74,76) provided on both sides of the heavily doped portion. Such a field-effect transistor device is advantageous in that it provides a surface potential locally increased to act as an energy barrier to minority carriers. This permits control over the threshold voltage of a MOS transistor or over the punch-through current of a punch-through transistor without having recourse to the use of a high carrier density throughout the channel region. The carrier density of the channel region being rather reduced, not only reduction in leakage current but improvement in withstand voltage characteristics can be achieved in a device according to the present invention. Where the transistor device is implemented as a trench-type device, the channel region composed of the differentially doped three portions is formed along a side wall of a trench in the substrate.

17 Claims, 9 Drawing Sheets

SEMICONDUCTOR DEVICE AND PROCESS FABRICATION THEREOF

This application is a continuation of application Ser. No. 339,937, filed Apr. 18, 1989, now abandoned, which is a continuation of application Ser. No. 259,487 filed Oct. 18, 1988, now abandoned, which is a continuation of application Ser. No. 901,091 filed Aug. 27, 1986, now abandoned.

FIELD OF THE INVENTION

The present invention relates in general to semiconductor devices and, in particular, to an insulated-gate field-effect transistor of, typically, the metal-oxide-semiconductor type. The present invention also relates to a process of fabricating such a semiconductor device. While the present invention is particularly useful when applied to a vertical or trench-type insulated-gate field-effect transistor device, the gist of the invention is also applicable to an insulated-gate field-effect transistor device of the planar type.

BACKGROUND OF THE INVENTION

A vertical or trench-type metal-oxide-semiconductor (hereinafter referred to as MOS) field-effect transistor is known which has a deep trench in a silicon substrate with a thin gate oxide film formed on a sidewall of the trench. The substrate is formed with drain regions located across the trench and spaced apart along the sidewall from the source region formed by the substrate so that a channel region vertically extends between the source region and each of the drain regions. As well known in the art, the threshold characteristics of such a trench transistor are controlled by varying the doping level of the substrate throughout the horizontal area of the layer spanning between the source and drain regions. Such doping techniques are contrasted by an ordinary channel doping process used for the fabrication of planar MOS devices in that the dopant atoms to be injected into the target are bombarded in directions generally parallel with the sidewall of the trench in the substrate. Difficulties are therefore encountered in controlling the impurity distribution profile selectively for the channel region alone of the trench transistor, thus requiring a tradeoff of varying the doping density throughout the horizontal area of the layer between the source and drain regions. When the gate oxide film is grown on the sidewall of the trench in the substrate thus doped throughout, the impurities which have been injected into the substrate tend to decrease in an area close to the trench sidewall due to outdiffusion induced by the thermal oxidation process. To compensate for such localized reduction in the density of impurities in the sidewall region of the substrate, it is required to have the substrate doped to a density higher than the desired doping level for the channel region which is to be formed by the sidewall region of the substrate. The use of an increased substrate doping level however causes various problems such as the deterioration of the dynamic and breakdown-voltage characteristics of the trench-type MOS field-effect transistor device.

It is, accordingly, an important object of the present invention to provide an improved insulated-gate field-effect transistor device which is easy for the control of the threshold voltage and is reliable in performance.

It is another important object of the present invention to provide a process of fabricating such an improved insulated-gate field-effect transistor device.

SUMMARY OF THE INVENTION

In accordance with one important aspect of the present invention, there is provided an insulated-gate field-effect transistor comprising (a) a source region of a first conductivity type, (b) a drain region of the first conductivity type, and (c) an intermediate region of a second conductivity type opposite to the first conductivity type, the intermediate region extending between the source region and the drain region, (d) the intermediate region along the direction of extent from the source region to the drain region having at least three portions which comprise of first, second and third portions of the second conductivity type, the third portion having a higher dopant level than and located between the first and second portions.

In accordance with another important aspect of the present invention, there is provided an insulated-gate field-effect transistor comprising (a) a first semiconductor layer of a first conductivity type, and (b) a second semiconductor layer of a second conductivity type opposite to the first conductivity type, the second semiconductor layer comprising at least three first, second and third sublayers, the third sublayer located between the first and second sublayers and having a higher dopant level than each of the first and second sublayers, and (c) a semiconductor region in the second semiconductor layer, the semiconductor region being of the first conductivity type, (d) the first, second and third sublayers extending in sequence between the first semiconductor layer and the semiconductor region.

In accordance with still another outstanding aspect of the present invention, there is provided an insulated-gate field-effect transistor comprising (a) a semiconductor layer of a first conductivity type, and (b) first, second, third, fourth and fifth semiconductor regions in the semiconductor layer, (c) the first semiconductor region being of the first conductivity type and having a higher dopant level than the semiconductor layer, (d) the second and third semiconductor regions being spaced apart from each other by the first semiconductor region, each of the second and third semiconductor regions being of the first conductivity type and having a lower dopant level than that the first semiconductor region, (e) the fourth and fifth semiconductor regions being spaced apart from each other by the first semiconductor region and being respectively in contact with the second and third semiconductor regions, each of the fourth and fifth semiconductor regions being of a second conductivity type opposite to the first conductivity type.

In accordance with still another outstanding aspect of the present invention, there is provided a semiconductor integrated circuit structure comprising (a) a first semiconductor layer of a first conductivity type, (b) a second semiconductor layer of a second conductivity type opposite to the first conductivity type, the second semiconductor layer comprising at least first, second and third sublayers, the third sublayer located between the first and second sublayers and being lower in carrier density than each of the first and second sublayers, and (c) a plurality of groups of semiconductor regions in the second semiconductor layer, the semiconductor regions being of the first conductivity type and being spaced apart from one another along the first second semiconductor layers, (d) the first, second and third sublayers having respective portions extending in sequence between the first semiconductor layer and each of the semiconductor regions.

In accordance with still another outstanding aspect of the present invention, there is provided a process of fabricating an insulated-gate field-effect transistor, comprising (a) preparing a first semiconductor layer of a first conductivity type, (b) selectively doping the first semiconductor layer for forming at the surface of the first semiconductor layer a first doped region of a second conductivity type opposite to the first conductivity type, (c) forming a second semiconductor layer of the first conductivity type on the first doped semiconductor layer with the first doped region buried between the first and second semiconductor layers, (d) selectively doping the second semiconductor layer for forming within the second doped semiconductor layer a second doped region of the first conductivity type, the second doped region being higher in doping level than the second semiconductor layer and being spaced apart from the first doped region and from the surface of the second semiconductor layer opposite to the first doped region, (e) further selectively doping the second semiconductor layer for forming at the surface of the layer a third doped region of the first conductivity type, the first, second and third doped regions being spaced apart from and at least in part aligned with one another across portions of the second semiconductor layer in the direction of thickness of the second semiconductor layer, (f) forming in the second semiconductor layer a concavity extending through the second and third doped regions and the aforesaid portions of the second semiconductor layer into the first doped region for thereby splitting each of the second and third doped regions into at least two portions, and (g) forming an insulator layer on portions of the surfaces defining the concavity so that the insulator layer has portions extending from the first doped region to the aforesaid portions, respectively, of the third doped region and contacting the aforesaid portions, respectively, of the second doped region and the aforesaid portions of the second semiconductor layer.

In accordance with still another outstanding aspect of the present invention, there is provided a process of fabricating an insulated-gate field-effect transistor, comprising (a) preparing a first semiconductor layer doped to a first conductivity type, (b) selectively doping the first semiconductor layer for forming at the surface of the first semiconductor layer a first doped region of a second conductivity type opposite to the first conductivity type, (c) forming a second semiconductor layer on the first semiconductor layer with the first doped region buried between the first and second semiconductor layers, the second semiconductor layer being doped to the first conductivity type, (d) forming a third semiconductor layer on the second semiconductor layer, the third doped region being doped to the first conductivity type and being higher in doping level than the second semiconductor layer, (e) forming a fourth semiconductor layer on the third semiconductor layer, the third doped region being doped to the first conductivity type and being lower in doping level than the third semiconductor layer, the doping level of each of the second, third and fourth doped regions varying continuously from one surface of the layer to the other, (f) selectively doping the fourth semiconductor layer for forming at the surface of the layer a second doped region of the second conductivity type, the first and second and third doped regions being spaced apart from and at least in part aligned with each other across portions of the second and third semiconductor layers in the direction of thickness of the individual layers, (g) forming a concavity extending through the second doped region and the second, third and fourth semiconductor layers into the first doped region for thereby splitting each of the second, third and fourth semiconductor layers and the second doped region into at least two portions, and (h) forming an insulator layer on portions of the surfaces defining the concavity so that the insulator layer has portions extending from the first doped region to the aforesaid portions, respectively, of the second doped region and contacting the aforesaid portions, respectively, of the second doped region and the aforesaid portions of the second, third and fourth semiconductor layers.

BRIEF DESCRIPTION OF THE DRAWINGS

The drawbacks of a prior-art MOS field-effect transistor device and the features and advantages of a device embodying to the present invention will be more clearly understood from the following description taken in conjunction with the accompanying drawings in which like reference numerals designate similar or corresponding elements, regions and portions and in which.

FURTHER DESCRIPTION OF THE PRIOR ART

Figure 1:
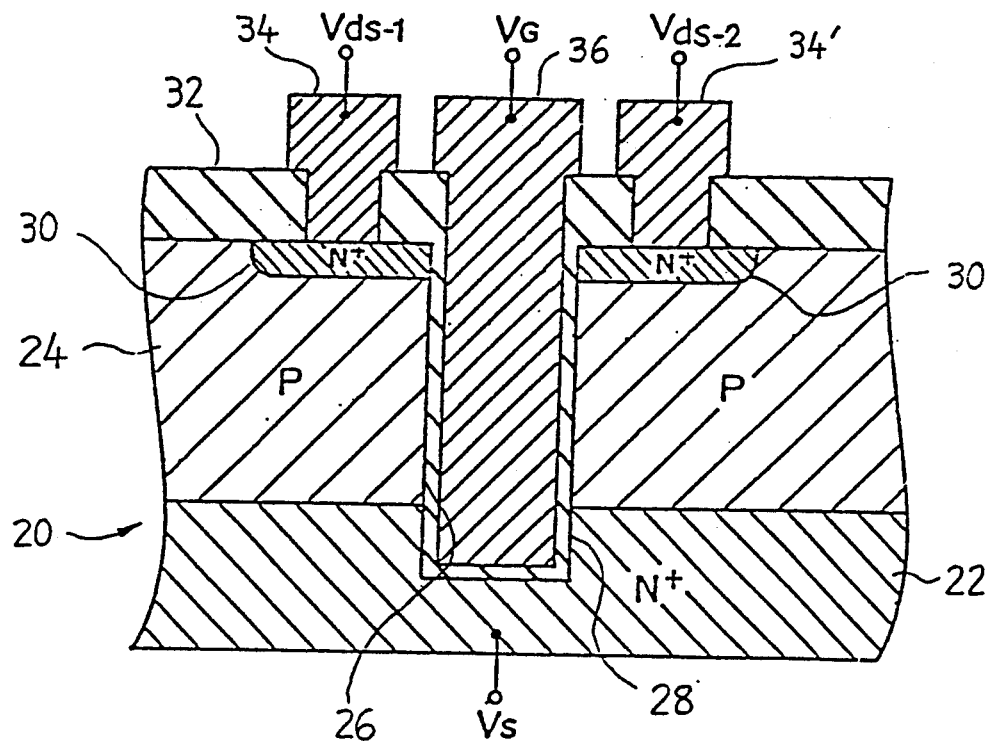
FIG. 1 is a fragmentary cross sectional view showing the construction of a known trench-type MOS field-effect transistor.
Figure 2:
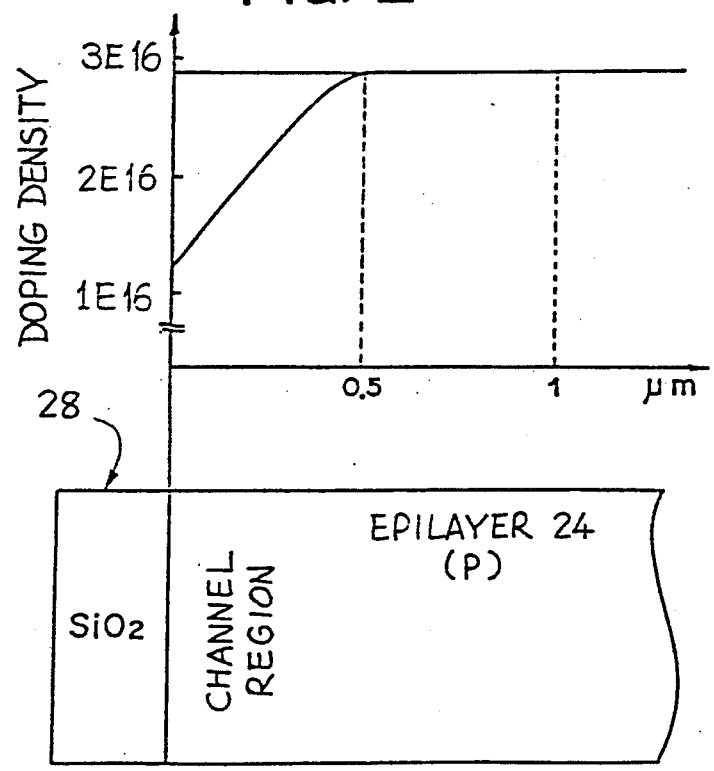
FIG. 2 is a view showing the impurity distribution profile of a doped substrate layer to form a channel region in the prior-art MOS field-effect transistor illustrated in FIG. 1.

Prior to entering into description of the detailed features of the present invention, some important aspects of a known trench-type MOS transistor device will be reviewed on a more detailed basis with reference to FIGS. 1 and 2.

Referring first to FIG. 1, a known trench-type MOS field-effect transistor device includes a silicon substrate 20 having a doped n+-type silicon layer 22 and a doped p-type epitaxial layer 24 overlying the n+-type silicon layer 22. The substrate 20 is formed with a trench 26 vertically extending throughout the thickness of the p-type epitaxial layer 24 into the underlying n+-type silicon layer 22. The sidewalls of the trench 26 are covered with a thermally grown thin oxide film 28 and the p-type epitaxial layer 24 has formed therein n+-type doped drain regions 30 and 30' which are separate from each other on both sides of the trench 26. The n+-type silicon layer 22 of the substrate 20 provides a source region vertically spaced apart from each of these drain regions 30 and 30' across the p-type epitaxial layer 24. The substrate 20 thus configured is covered with a passivation layer 32 of silicon oxide, through which drain electrodes 34 and 34' extend into contact with the drain regions 30 and 30', respectively, and a gate electrode 36 extends into the trench defined by the gate oxide film 28.

Between each of the drain regions 30 and 30' and the source region formed by the substrate 22 is thus provided a channel region which vertically extends along the gate oxide film 28 on one sidewall of the trench 26. A current passes through the n+-type channel region between the source region and each of the drain regions 30 and 30' when supply voltages $V_{ds-1}$ and $V_{ds-2}$ are applied to the drain electrodes 34 and 34', respectively, and a control voltage $V_G$ higher than the threshold voltage of the device applied to the gate electrode 36 with a suitable source voltage $V_s$ of, for example, ground level applied to the n+-type silicon layer 22 as shown. The threshold voltages of trench-type MOS field-effect transistors are usually selected at relatively large values of, for example, 1 volt where a supply voltage of 5 volts is used to achieve desired noise margins (which are the measures indicating the degrees of stability of outputs to deviations in inputs). In an n-channel MOS field-effect transistor using a 500 angstrom gate oxide film and a gate electrode of polysilicon, for example, the doping level required for the p-type substrate to achieve the threshold voltage of 1 volt is about 3E16 atoms/cm$^{-3}$ where boron is used as the acceptor-type dopant.

The threshold voltage of a trench-type MOS field-effect transistor such as the device shown in FIG. 1 is usually controlled by varying the impurity distribution profile of the p-type epitaxial layer 24 throughout the horizontal area of the epitaxial layer 24. This is because of the fact that ordinary channel doping techniques bombarding dopant atoms in directions normal to the substrate are practically inoperable for the fabrication of trench-type devices as previously noted. When the gate oxide film 28 is thermally grown on the sidewalls of the trench 26 in the substrate 20 having the p-type epitaxial layer 24 thus doped throughout its area, the dopant atoms density in the epitaxial layer 24 tend to decrease toward the trench sidewalls as will be seen from the impurity distribution profile shown in FIG. 2. Such an effect is known as "pile down" and depends for its degree of seriousness on such parameters as the oxidation temperature, oxidation time and chemical composition of the oxidation ambient used.

A practically feasible sole expedient to compensate for such localized reduction in the density of impurities in the sidewall regions of the substrate 20 has been to have the p-type epitaxial layer 24 of the substrate doped to a density higher than the actually desired doping level for the channel regions of the substrate 20. In the case of the n-channel MOS field-effect transistor having the p-type substrate doped with boron to the density of about 3E16 atoms/cm$^{-3}$ as above exemplified, it is thus required to have recourse to the use of a doping density of as high as 5E16 atoms/cm$^{-3}$ or even more as indicated in FIG. 2. A still higher doping level for the epitaxial layer 24 is required to achieve the required threshold (and subthreshold) characteristics as channel lengths become shorter and gate oxide films become thinner. The use of an increased substrate doping level however results in an increase in the back-gate bias sensitivity of the threshold voltage and accordingly in an increase in the source/drain-to-substrate junction capacitances and this in turn gives to an increase in the the device parasitic capacitance and an increase in the leakage currents through the source/drain-to-substrate pn junctions. All these are responsible for the various objectionable effects such as the deterioration of the dynamic and breakdown voltage characteristics of the trench-type MOS device as previously noted.

DESCRIPTION OF THE PREFERRED EMBODIMENTS

Figure 3:
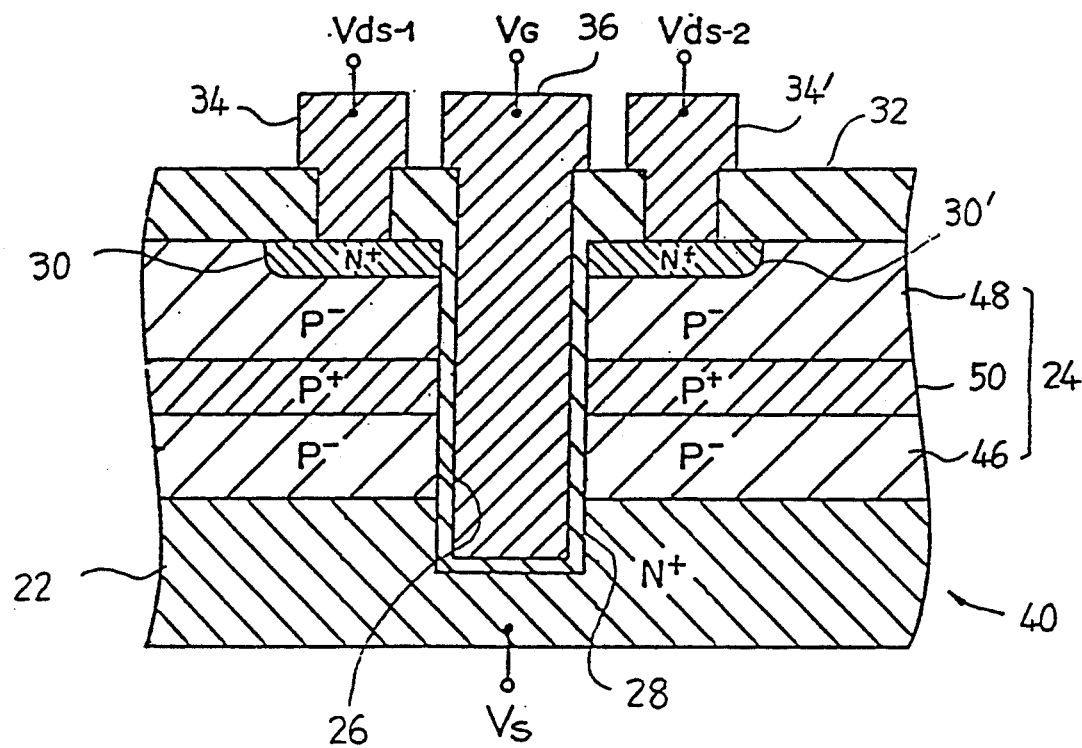
FIG. 3 is a fragmentary cross sectional view showing the basic construction of some preferred trench-type insulated-gate field-effect transistor device embodiments of the present invention.
Figure 4:
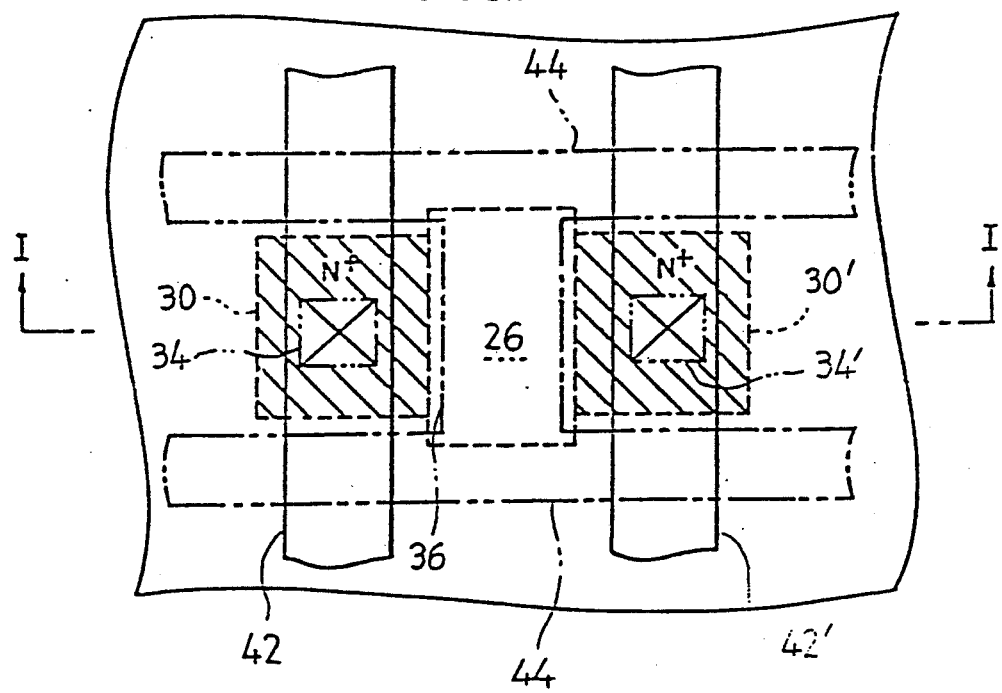
FIG. 4 is a plan view of the semiconductor structure shown in FIG. 3, the cross section of FIG. 3 being taken along line I—I in FIG. 4.

In FIGS. 3 and 4 is illustrated the basic construction of preferred embodiments of an insulated-gate field-effect transistor device embodiment of the present invention. The device herein shown is of the vertical or trench type and comprises a silicon substrate 40 having a doped n+-type silicon layer 22 and a doped p-type epitaxial layer 24 overlying the n+-type silicon layer 22 similarly to the substrate 20 of the prior-art device shown in FIG. 1. The doped n+-type silicon layer 22 may be in the form of a buried region formed between the p-type epitaxial layer 20 and another p-type silicon layer underlying the epitaxial layer 24, though not herein shown. The silicon substrate 40 is formed with a deep trench 26 vertically extending through-out the thickness of the p-type epitaxial layer 24 into the underlying n+-type silicon layer 22. The trench 26 in the substrate 40 has a generally U-shaped vertical section as will be seen from FIG. 3 and a generally rectangular cross section as will be seen from FIG. 4. Such a trench 26 is formed typically using reactive ion etching (RIE) techniques. On the sidewalls of the trench 26 is thermally grown a thin oxide film 28 which provides the gate oxide for the MOS field-effect transistor device. The p-type epitaxial layer 24 has formed therein n+-type doped drain regions 30 and 30' which are spaced apart from each other across the upper open end of the trench 26 as shown. The n+-type silicon layer 22 of the substrate 20 provides a source region vertically spaced apart from each of these drain regions 30 and 30' across the p-type epitaxial layer 24. On the surface of the substrate 40 thus configured in section is provided a passivation layer 32 of silicon oxide. The passivation layer 32 is formed with contact openings through which drain electrodes 34 and 34' extend into contact with the drain regions 30 and 30', respectively, and a gate electrode 36 of, for example, polysilicon extends into the trench defined by the gate oxide film 28. The drain electrodes 34 and 34' may be coupled to or form part of conductive bit line straps 42 and 42', respectively, and, likewise, the gate electrode 36 may be coupled to or form part of conductive word line straps 44 as shown in FIG. 4 where the device under consideration is to constitute or form part a memory cell of a semiconductor memory device. The device embodying the present invention is, to the extent described hereinbefore, basically similar in construction to the silicon substrate in the prior-art device shown in FIG. 1.

In the MOS field-effect transistor device shown in FIGS. 3 and 4 embodying the present invention, the p-type silicon layer 24 comprises at least three sublayers which are herein shown as a lightly doped lower p⁻-type sublayer 46, a lightly doped upper p⁻-type sublayer 48 and a heavily doped intermediate p+-type sublayer 50. The lightly doped lower p⁻-type sublayer 46 forms the lowermost sublayer of the p-type epitaxial layer 24 and thus directly overlies the n+-type silicon layer 22, while the lightly doped upper p⁻-type sublayer 48 forms the uppermost sublayer of the p-type epitaxial layer 24 and, thus, in part directly underlies the silicon-oxide passivation layer 32 and in part underlies the n+-type drain regions 30 and 30'. The heavily doped intermediate p+-type sublayer 50 intervenes between these lightly doped lower and upper p⁻-type sublayers 46 and 48 either directly as shown or across any additional p-type sublayer or sublayers. Each of the lower and upper p⁻-type sublayers 46 and 48 is lightly doped with an acceptor-type dopant such as boron density of, for example, 1E16 atoms/cm⁻³ and the intermediate p+-type sublayer 50 is heavily doped with the same acceptor-type dopant to a density of, for example, 5E16 atoms/cm⁻³. If the doped n+-type silicon layer 22 is provided in the form of a buried region between the p-type epitaxial layer 20 and another p-type silicon layer as above noted, each of the lower and upper p⁻-type sublayers 46 and 48 may be provided by portions of such a p-type silicon layer of the substrate.

Figure 5:
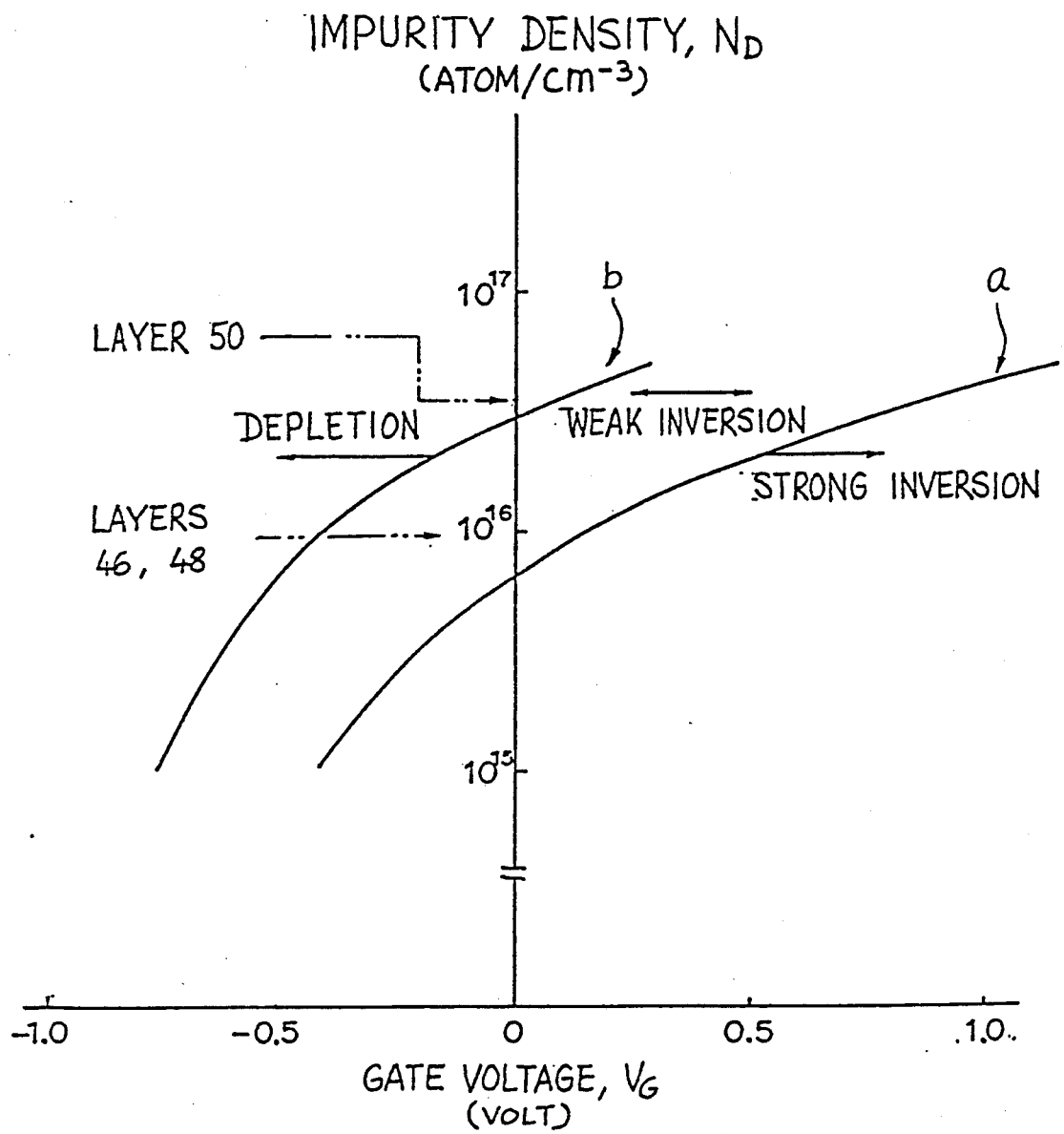
FIG. 5 is a view showing the transition between different carrier inversion states of a semiconductor substrate in terms of the relationship between the impurity density of the substrate and the voltage applied to the gate of a MOS device using the substrate.
Figure 6:
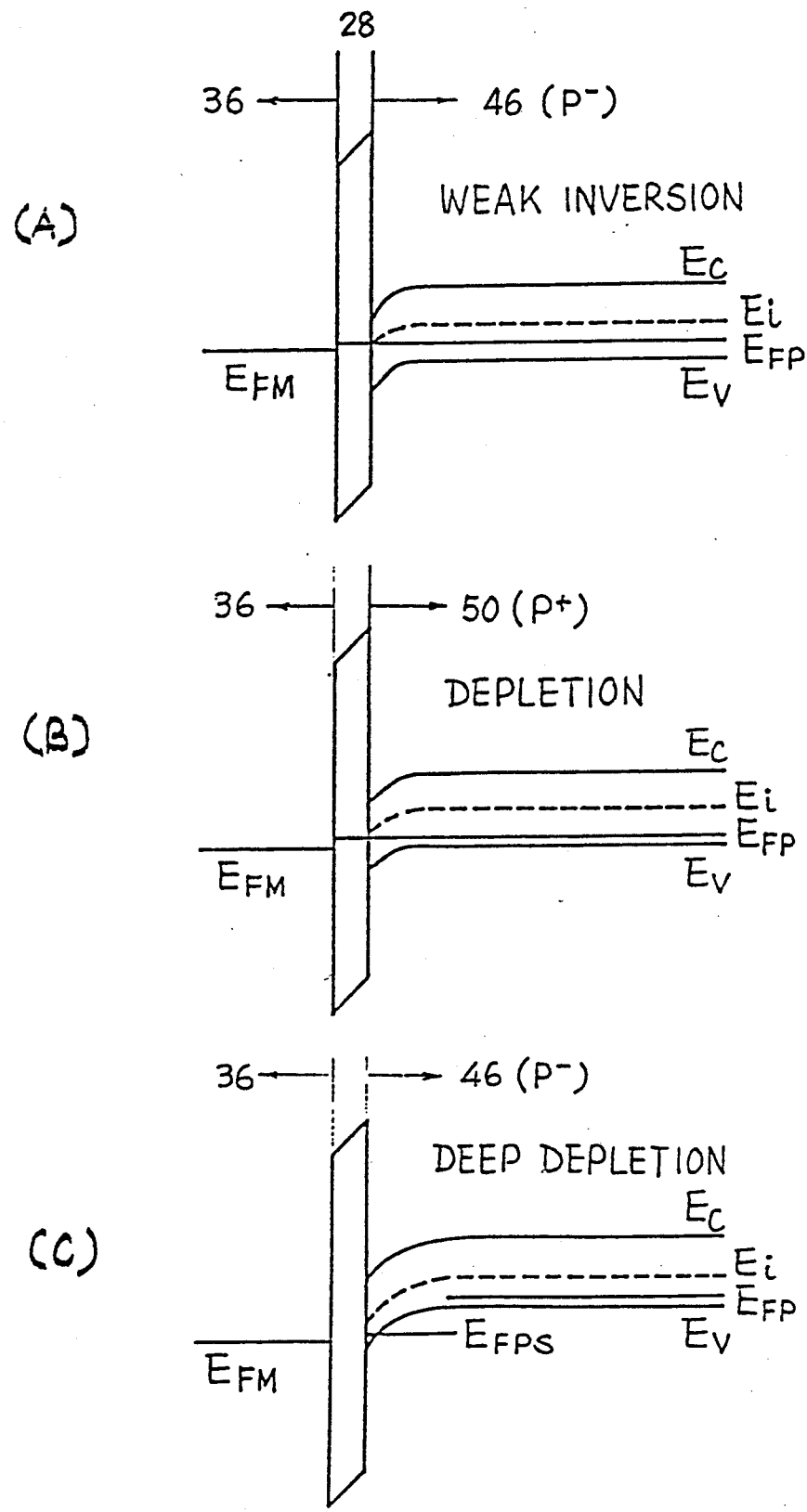
FIGS. 6A to 6C are energy band diagrams for the individual sublayers of a semiconductor layer forming part of the structure shown in FIG. 3.

Assume, now, that a voltage of, for example, 5 volts is applied to each of the drain electrodes 34 and 34' with a ground potential established at the gate electrode 36. As well known in the art of MOS technology, a semiconductor substrate of, for example, p-type has a depletion layer at a surface region of the substrate when the surface potential $\phi_s$ is less than the bulk potential $\phi_b$ with positive charges $Q_s$ accumulated in the surface region. The surface potential $\phi_s$ is given by $$\phi_s = (Q_s/kT)\ln(P_p/n_i),$$

where T is the absolute temperature, $P_p$ is the density of the acceptor-type impurities of the substrate, and $n_i$ is the density of carriers in an intrinsic state. When the surface potential $\phi_s$ becomes nearly two times higher than the bulk potential $\phi_b$, there appears at the surface of the substrate a strong inversion state which is contrasted by a weak inversion state to appear between the depletion state and the strong inversion state. In FIG. 5 is shown the transition between these different carrier inversion states in terms of the relationship between the impurity density $N_a$ of a substrate and the voltage $V_g$ applied to the gate of the MOS device using the substate. As will be seen from the transition curves of FIG. 3, that region of the substrate which has an impurity density of 1E16 atoms/cm⁻³, viz., the lightly doped lower p⁻-type sublayer 46 of the structure shown in FIG. 3 assumes a weak inversion state while that region of the substrate which has an impurity density of 5E16 atoms/cm⁻³, viz., the heavily doped intermediate p+-type sublayer 50 of the structure shown in FIG. 3 assumes a depletion state. The lightly doped upper p⁻-type sublayer 48 having an impurity density of 1E16 atoms/cm⁻³ could also assume a weak inversion state but is actually in a non-equilibrium or deep depletion state with no minority carriers injected into the sublayer. FIGS. 6A, 6B and 6C show energy band diagrams of the lower p⁻-type sublayer 46, intermediate p+-type sublayer 50 and upper p⁻-type sublayer 48, respectively, exhibiting these phenomena. In each of FIGS. 6A, 6B and 6C, $E_V$ is representative of the band edge of the valence band, $E_C$ representative of the band edge of the conduction band, $E_{FM}$ representative of the Fermi level at the gate electrode 36, $E_{FP}$ representative of the Fermi level of the substrate, and $E_i$ representative of the intrinsic Fermi level. Denoted by $E_{FPS}$ in FIG. 6C is the surface potential of the upper lightly doped p⁻-type sublayer 48.

When a voltage of the ground level is established at the gate electrode 36 as above noted, the current which attempts to flow between the source and drain regions 30 and 30' is allowed to flow through the lower p⁻-type sublayer 46 but is prohibited from flowing far into the other sublayers 50 and 48 of the epitaxial layer 24, thus producing a zero current between the source and drain regions 30 and 30'. If the width of the sublayers 50 and 48 (viz., the measurement of the sublayers in vertical direction through the sublayers) is of an extremely small value so that a field is applied thereacross, a drift current would flow through these sublayers 50 and 48. Such a drift current will however not exceed the current (subthreshold current) which is to flow through the lower p⁻-type sublayer 46 in a weak inversion state. This subthreshold current, $I_{DS}$, is given as an exponential function of the voltage $V_x$ applied to the drain-side surface of the p⁻-type sublayer 46 and is written in the form $$I_{DS} = (W/L)A[1 - \exp(-BV_x)],$$

where W is the "width" (above defined) of the sublayer 46, L is the distance between the sublayer 46 and the n+-type silicon layer 22, and A and B are constants. An increase in the drain voltage $V_x$ toward 5 volts however gives rise to reduction in the drift current through the sublayers 50 and 48 and consequently a drop in the voltage across the sublayer 46. An equilibrium state is thus achieved when the drift current which flows through the sublayers 50 and 48 settles at a certain small value.

When a voltage of a high level is applied to the gate electrode 36, the intermediate p+-type sublayer 50 shifts from the depletion state to a weak inversion state as will be seen from FIG. 5, then the lower p−-type sublayer 46 assumes an almost perfectly strong inversion state. Under this condition, minority carriers are allowed to move from the p+-type sublayer 48 far to the surface of the upper p−-type sublayer 48, which thus exhibits an inversion or pinch-off state. A current determined by the subthreshold current $I_{DS}$ through the sublayer 46 now passes between the source and drain of the device. The magnitude of this can be calculated by solving equations for the series circuit composed of the three MOS transistors having channel regions formed by the sublayers 46, 50 and 48.

While the behaviors of the MOS field-effect transistor device embodying the present invention has thus far been described in terms of the relationship between the gate voltage used and the transition between the different carrier inversion states, the threshold voltage of the device can be controlled in any of the following two manners:

(1) The "width" of each of the lightly doped p−-type sublayer 48 and the heavily doped p+-type sublayer 50 is selected at a relatively large value so that the voltage to be applied to the interface between the sublayers 48 and 50 is limited below a relatively small value for reducing the subthreshold current which will flow through the p+-type sublayer 50. In this instance, the threshold voltage of the device can be defined by the p+-type sublayer 50.

(2) The width of the heavily doped intermediate p+-type sublayer 50 is selected at an extremely small value and the width of the lightly doped intermediate p+-type sublayer 48 selected at a relatively large value to inhibit the flow of current only when the p+-type sublayer 50 is in a depletion state. When the sublayer 50 shifts to a weak inversion state, there flows through the device a current of a magnitude inappropriate for the non-conduction state of the device due to the extremely small width of the sublayer 50, viz., due to the extremely small share which the sublayer 50 has for the channel length through the epitaxial layer 24. In this instance, the threshold voltage of the device can be defined by the transition of the sublayer 50 from the depletion state to the weak inversion state.

The MOS field-effect transistor device having the construction described with reference to FIGS. 3 and 4 can be fabricated by a process shown in FIGS. 7A to 7E.

Figure 7A:
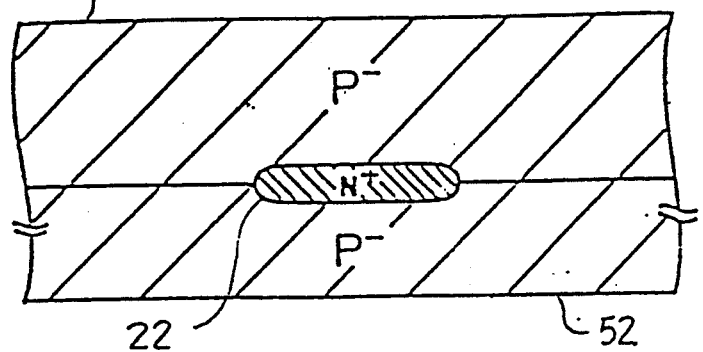
FIGS. 7A to 7E are fragmentary cross sectional views of semiconductor structures formed at some stages of a device fabrication process exemplifying a process of fabricating a MOS field-effect transistor device embodiment of the present invention.

(a) The process of fabricating the field-effect transistor device starts with preparation of a p−-type silicon substrate 52 (FIG. 7A) having a silicon oxide film (not shown) formed on one surface of the substrate 52. The oxide film is patterned and etched with use of a suitable photoresist mask (not shown) placed on the oxide film to form in the oxide film a window having a desired geometry. The silicon substrate 52 is thus allowed to have a portion of its surface exposed through the window defining an active area over which MOS field-effect transistors are to be fabricated on the substrate 52. A donor-type dopant such as for example phosphorus is diffused or implanted into the silicon substrate 52 selectively through the window in the oxide film to form a heavily doped n+-type region in the bulk substrate. The heavily doped n+-type region is driven into the silicon substrate 52 in an oxidizing ambient to form a buried layer region 22 in the substrate 52. The oxide film is then stripped from the surface of the substrate 52, whereupon a p−-type epitaxial layer 24 is grown to a thickness of, for example, 2 microns on the substrate 52. This p−-type epitaxial layer 24 is doped with a donor-type dopant with a dose selected to result in a doping density of, for example, 1E16 atoms/cm$^{-3}$. Concurrently with the epitaxial growth of the p−-type epitaxial layer and further by subsequent high-temperature steps employed in the fabrication process, the donor-type impurities in the heavily doped n+-type buried layer region 22 are caused to out-diffuse upwardly into the p−-type epitaxial layer 24. FIG. 7A shows the semiconductor structure obtained at this stage of the fabrication process.

Figure 7B:
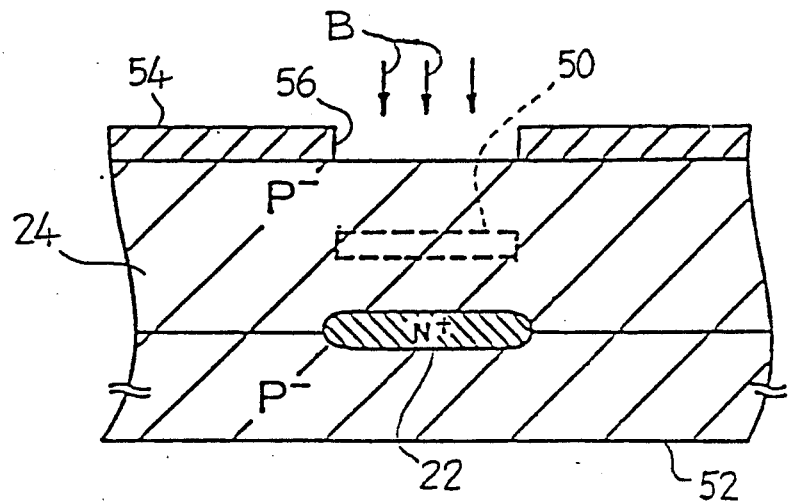
Figure 8:
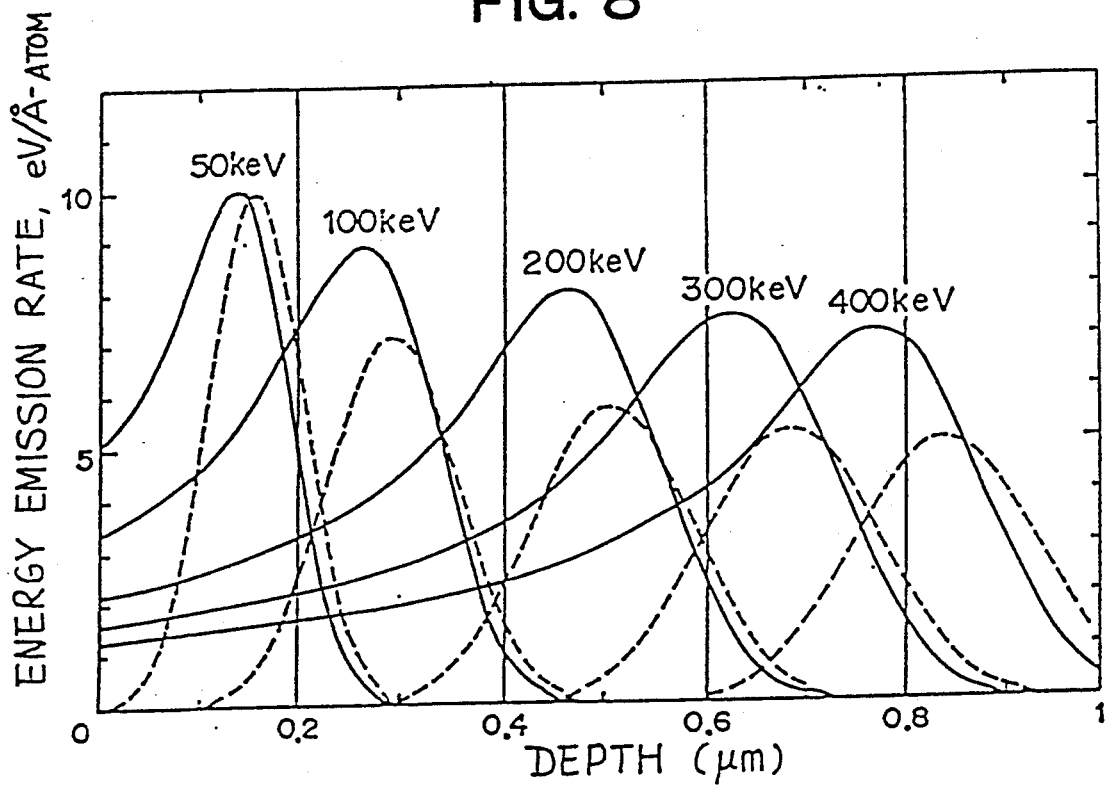
FIG. 8 is a graphic representation of examples of the relationship between the ion penetration depth and the energy emission rate for various ion-beam acceleration voltages used in implantation of dopant ions into silicon substrates, also indicated (by dotted lines) being the penetration depth and the incident ion stopping distribution possibilities.

(b) A new silicon oxide film 54 is then formed on the surface of the p−-type epitaxial layer 24 as shown in FIG. 7B. The oxide film is patterned and etched with use of a suitable photoresist mask (not shown) placed on the oxide film 54 to form in the oxide film a window 56 located over and in registry with the n+-type buried layer region 22. A suitable acceptor-type dopant such as for example boron is implanted into the p−-type epitaxial layer 24 selectively through the window 56 in the oxide film 54 as indicated by arrows B in FIG. 7A. The dose to be used for this ion implant process is selected to give an doping density of, for example, 5E16 atoms/cm$^{-3}$. The ion acceleration energy and/or the initial energy to be imparted to the ion beam for this implant process is selected so that the atoms bombarded onto the target penetrate to a desired depth below the surface of the epitaxial layer 24 as indicated by dotted lines in FIG. 7B. FIG. 8 of the drawings shows examples of the relationship between the penetration depth in microns and the energy emission rate in eV/Å-atom for various ion-beam acceleration voltages 50 keV to 400 keV. Indicated by curves in dotted lines are the ion stopping distribution possibilities with which the incident ions are likely to stop within the target when the different ion-beam acceleration voltages are used. As will be seen from this FIG. 8, the penetration depth of ions can be selected at any value larger than 0.8 micron when the acceleration voltage is selected within a range of from 400 keV to 1 MeV. Where the p−-type epitaxial layer 24 is formed to the thickness of, for example, 2 microns as previously noted, the acceptor-type dopant such as boron may thus be injected into the p−-type epitaxial layer 24 to a depth of, for example, 1 micron or any depth larger than 0.8 micron using the ion-beam acceleration voltage of 400 keV to 1 MeV.

Figure 7C:
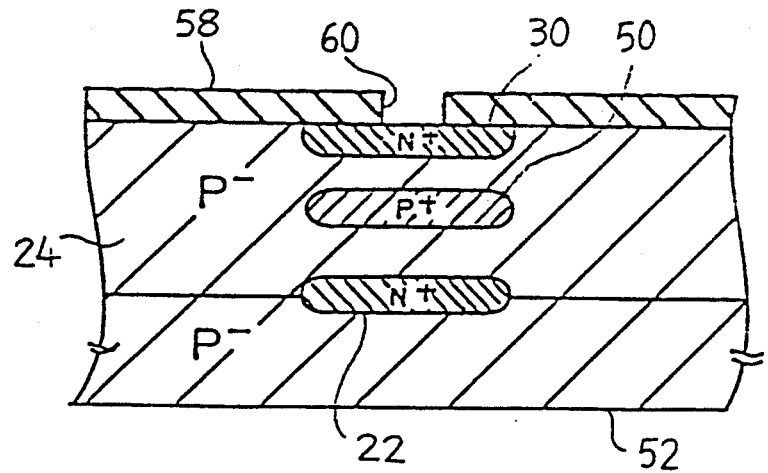

(c) As a result of such an ion implantation process, a heavily doped p+-type intermediate layer region 50 is thus formed within the p−-type epitaxial layer 24. The heavily doped p+-type intermediate layer region 50 intervenes between the n+-type buried layer region 22 and the surface of the p−-type epitaxial layer 24 as shown in FIG. 7C. After the structure is annealed to remedy the implant-induced defects in the bulk silicon forming the epitaxial layer 24, a suitable donor-type dopant is diffused into the p−-type epitaxial layer 24 with the oxide film 54 used as a mask to form a heavily doped n+-type layer region 30 overlying and spaced apart from the p+-type layer region 50 as shown in FIG. 7C. The oxide film 54 is then stripped from the epitaxial layer 24 and another silicon oxide film 58 is formed on the surface of the p−-type epitaxial layer 24 and is patterned and etched to form a window 59. The window 59 thus formed in the oxide film 58 is located on a limited area of the n+-type layer region 30 and is shaped to define a desired cross sectional configuration of the trench to be formed such as, for example, the rectangular cross section of the trench 26 shown in FIG. 4.

Figure 7D:
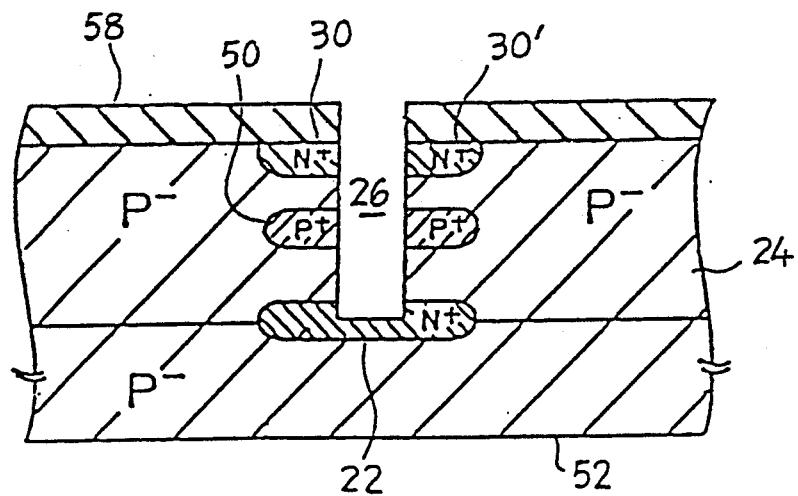

(d) The oxide film 58 is then used as a mask to etch the epitaxial layer 24 through such a window 59 in the oxide film 58. Reactive ion etching techniques are typically used for this etching process to excavate a deep trench 26 having a generally U-shaped vertical section and extending through the n+-type and p+-type layer regions 30 and 50 into the n+-type buried layer region 22 as shown in FIG. 7D. After the trench 26 has been excavated, the trench sidewalls are by preference cleaned of the RIE-induced damage and contamination by an additional wet acid etching process. With the trench 26 thus formed in the epitaxial layer 24, each of the heavily doped n+-type and p+-type layer regions 30 and 50 in the epitaxial layer 24 is split into two regions separate from each other across the upper end of the trench 26, thereby forming two separate n+-type drain regions 30 and 30' and two separate p+-type intermediate regions 50 and 50' on both sides of the trench 26 as also shown in FIG. 7D. As will be readily understood, that layer portion of the p−-type epitaxial layer 24 which intervenes between the n+-type buried layer region 22 and the p+-type intermediate regions 50 and 50' correspond to the lower p−-type sublayer 46 of the structure shown in FIG. 3 and, likewise, that layer portion of the p−-type epitaxial layer 24 which intervenes between the n+-type drain regions 30 and 30' and the p+-type intermediate regions 50 and 50' corresponds to the lower p−-type sublayer 46 of the structure shown in FIG. 3. Upon formation of the trench 26 as above described, the silicon oxide film 58 is removed from the surface of the epitaxial layer 24.

Figure 7E:
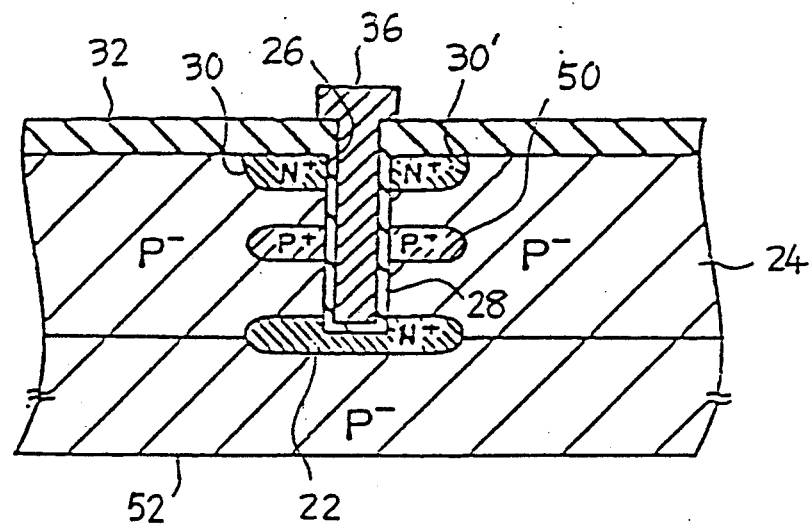

(e) Another fresh silicon oxide film is then thermally grown on the horizontal surface of the epitaxial layer 24 to form a passivation layer 32 and on the vertical faces of the sidewalls of the trench 26 to form a gate oxide film 28 as shown in FIG. 7E. Thereupon, heavily doped polysilicon is conformally deposited typically by low-pressure chemical vapor deposition techniques to fill the trench now defined by the oxide film 26, the polysilicon being heavily doped with a donor-type during deposition. The polysilicon layer is patterned and selectively plasma etched to leave a gate electrode 36 protruding upwardly from the surface of the silicon oxide passivation layer 32.

Figure 9:
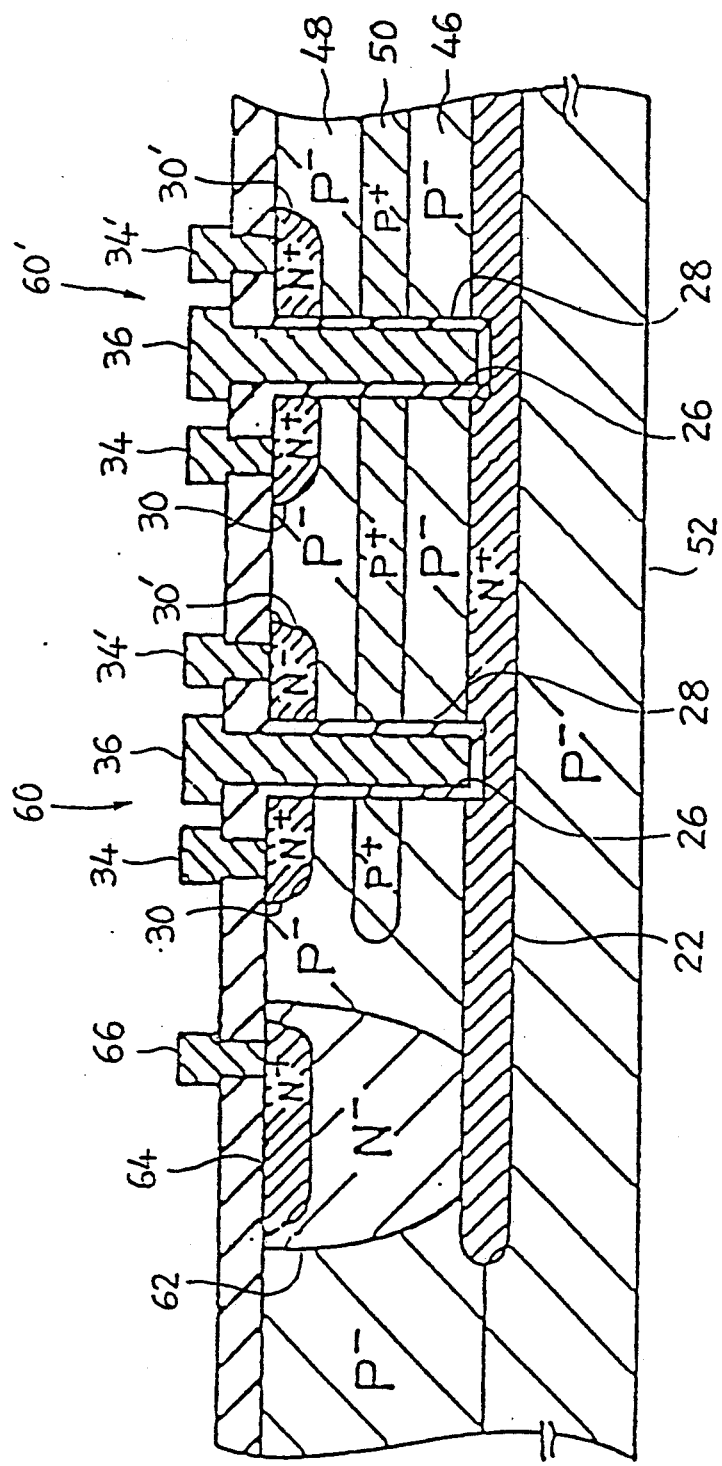
FIG. 9 is a fragmentary cross sectional view showing an example of a semiconductor integrated circuit structure including active devices each implemented by the MOS field-effect transistor device illustrated in FIGS. 3 and 4.

The MOS field-effect transistor device fabricated as hereinbefore described may be provided in the form of a discrete device but is, in actuality, typically provided as one of a number of active devices fabricated on a single substrate 52. FIG. 9 shows a portion of such a semiconductor integrated circuit structure, wherein the number of active devices provided thereon is represented by two MOS field-effect transistor devices 60 and 60'. Each of these MOS field-effect transistor devices 60 and 60' in the integrated circuit structure herein shown is assumed to be similar in construction to the device illustrated in FIGS. 3 and 4 and is thus shown having drain electrodes 34 and 34' extending into contact with the drain regions 30 and 30', respectively, through the passivation layer 32 in addition to the gate electrode 36 of doped polysilicon. Thus, the semiconductor integrated circuit structure has in the p−-type epitaxial layer 24 a plurality of drain regions 30 and 30' which are spaced apart from one another along the n+-type buried silicon layer 22 and the p−-type epitaxial layer 24. These drain regions 30 and 30' are arranged in pairs (or in groups in general) respectively in association with the trenches 26 in the p−-type epitaxial layer 24.

In the semiconductor integrated circuit structure shown in FIG. 9, the respective p+-type regions of the individual field-effect transistor devices 60 and 60' are provided commonly by a single p+-type layer 50 formed in the epitaxial layer 24 and, likewise, the respective n+-type buried regions of the individual field-effect transistor devices 60 and 60' are provided commonly by a single n+-type buried layer 22 between the p−-type silicon substrate 52 and the p-type epitaxial layer 24. In the p−-type epitaxial layer 24 is further formed a conductor region provided by an n−-type well 62 which has an n+-type contact region 64 formed therein for electrical connection to a source electrode 66. This source electrode 66 extends through the passivation layer 32 into contact with the contact region 64 so that a source voltage of, for example, ground level is applied through the source electrode 66, n+-type contact region 64 and n−-type well 62 to the n+-type buried silicon layer 22. The conductor region provided by the n−-type well 62 thus provides electrical connection to all of the gate electrodes 36 through the n+-type buried silicon layer 22.

The field-effect transistor devices 60 and 60' formed on the integrated circuit structure shown in FIG. 9 being assumed to be constructed and arranged as shown in FIG. 4, each of the field-effect transistor devices 60 and 60' consists of a pair of field-effect transistors. One of these two field-effect transistors is composed of one of the n+-type drain regions 30 and 30', the channel region on one side of the trench 26 and the source region provided by the common n+-type buried layer 22 and the other is composed of the other of the drain regions 30 and 30', the channel region on the other side of the trench 26 and the source region also provided by the common n+-type buried layer 22. The n+-type buried layer 22 common to the field-effect transistor devices 60 and 60' each consisting of such two field-effect transistors is required to extend in plan over a long distance or a large area on the silicon substrate 52 and for this reason tends to create a bias voltage which corresponds to the voltage drop through the layer 50. When carriers are injected from the n+-type buried layer 22 into the epitaxial layer 24, the parasitic n-p-n bipolar transistor provided by the n+-type buried layer 22, p−-type epitaxial layer 24 and each of the n+-type drain regions 30 and 30' attempts to turn on in the presence of such a bias voltage. Such an attempt of the parasitic bipolar transistor is however impeded by the heavily doped p+-type regions 50 and 50' in the p−-type epitaxial layer 24 since the regions 50 and 50' act as energy barriers to the carriers injected from the n+- type buried layer 22. Such energy barriers are effective to reduce the current gain of the bipolar transistor which is accordingly disabled from being turned on, enabling each of the MOS field-effect transistors to operate properly as such.

Figure 10:
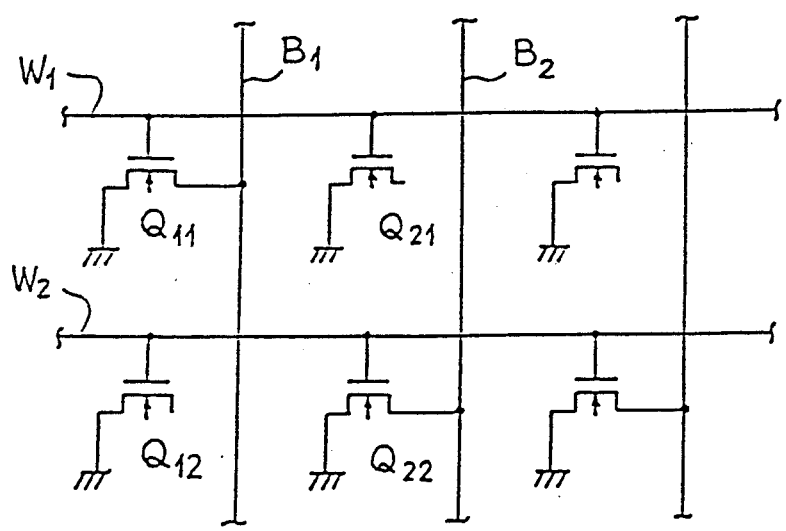
FIG. 10 is a circuit diagram showing a portion of a memory array incorporating the semiconductor integrated circuit structure shown in FIG. 9.

The MOS field-effect transistor devices integrated on a single substrate as in the semiconductor integrated circuit structure shown in FIG. 9 will find a useful application for implementing the memory array of a mask read only memory (mask ROM) system. A portion of such a memory array is illustrated in FIG. 10, wherein every pair of the shown MOS field-effect transistors is assumed to be constituted by each of the MOST field-effect transistor devices 60 and 60' representing the number of such devices provided on the integrated circuit structure shown in FIG. 9. The individual field-effect transistors respectively form memory cells arranged in columns as indicated at $Q_{11}$, $Q_{12}$, ... and in rows as indicated at $Q_{11}$, $Q_{21}$, ... are respectively located at crossings of row or bit lines $B_1$, $B_2$, ... and column or word lines $W_1$, $W_2$, ... as shown. As will be readily understood, the bit lines $B_1$, $B_2$, ... and the word lines $W_1$, $W_2$, ... herein shown respectively correspond to the bit line straps 42 and 42' and the word line straps 44 shown in the arrangement of FIG. 4. Each of the field-effect transistor devices 60 and 60' shown in FIG. 9 has its gate electrode 36 connected to one of the word lines $W_1$, $W_2$, ... and further has one of its drain electrodes 34 and 34' optionally connected to one of the bit lines such as the bit line $B_1$ and the other drain electrode optionally connected to the adjacent bit line such as the bit line $B_2$. Furthermore, the common source electrode 66 of the structure shown in FIG. 9 is connected to ground line in the memory array illustrated in FIG. 10. While all the memory transistors shown in FIG. 10 are assumed to have their drain electrodes 34/34' connected to at least one of the bit lines $B_1$, $B_2$, ..., some of the transistors provided in the memory array under consideration have their drain electrodes 34/34' left disconnected from the bit lines which are not herein shown.

When a voltage higher than the threshold voltage of each of the field-effect transistor devices thus arranged is applied to a selected one of the word lines such as the word line $W_1$, all the memory cell transistors $Q_{11}$, $Q_{21}$, ... associated with the particular word line $W_1$ and having their drain electrodes 34/34' connected to the bit lines turn on. All the bit lines $B_1$, $B_2$, ... connected to the particular transistors are accordingly connected to ground so as to output logic "0" signals from the memory array. On the other hand, the memory cell transistors having their drain electrodes 34/34' disconnected from the bit lines remain in non-conduction state and thus output logic "1" signals from the memory array.

Figure 11:
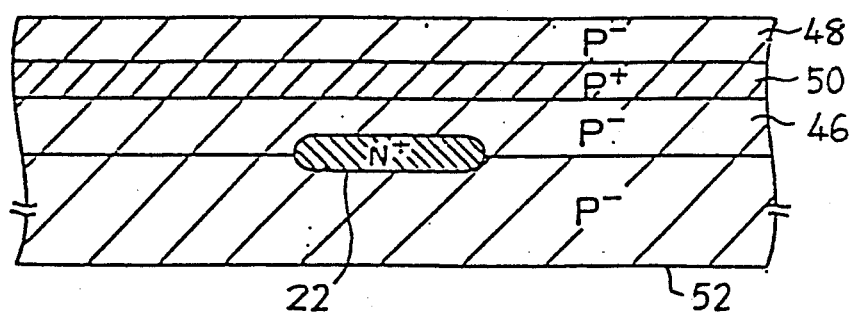
FIG. 11 is a fragmentary cross sectional view of a semiconductor structure formed at an initial stage of another device fabrication process exemplifying a process of fabricating a trench-type MOS field-effect transistor device embodying the present invention.

In FIG. 11 is shown a semiconductor structures formed at an initial stage of another device fabrication process exemplifying a process of fabricating a MOS field-effect transistor device embodiment of to the present invention. The process herein shown is characterized by the use of a "ramp" epitaxial process for the formation of the layer corresponding to the epitaxial layer 24 in the device fabricated by the process described with reference to FIGS. 7A to 7E.

The process of fabricating the field-effect transistor device as herein shown also starts with preparation of a p⁻-type silicon substrate 52 having a silicon oxide film (not shown) formed on one surface of the substrate 52. The oxide film is patterned and etched with use of a suitable photoresist mask (not shown), whereupon a donor-type dopant such as for example phosphorus is diffused or implanted into the silicon substrate 52 selectively through the window in the oxide film to form a heavily doped n⁺-type region in the bulk substrate. The heavily doped n⁺type region is driven into the silicon substrate 52 in an oxidizing ambient to form a buried layer region 22 in the substrate 52 and thereafter the oxide film is stripped from the surface of the substrate 52.

On the resultant structure are successively formed a lightly doped lower p⁻-type epitaxial sublayer 46 on the surface of the substrate 52, a heavily doped intermediate p⁺-type epitaxial sublayer 50 on the surface of the sublayer 46, and a lightly doped upper p⁻-type epitaxial sublayer 48 on the surface of the sublayer 50. These p⁻-type epitaxial sublayer 46, p⁻-type epitaxial sublayer 48 and p⁺-type epitaxial sublayer 50 correspond the lower, upper and intermediate sublayers, respectively, of the p-type epitaxial layer 24 in the device described with reference to FIGS. 3 and 4. Each of the p-type epitaxial sublayers 46, 48 and 50 is grown to a thickness selected so that the final thickness of the stack of the sublayers becomes, for example, 2 microns on the substrate 52. In the ramp epitaxial grows process herein used, each of the sublayers 46, 48 and 50 is doped during the epitaxial growth of the sublayer such that the dose used for the doping continuously varies with time. Accordingly, each of the lower p⁻-type epitaxial sublayer 46 and the upper p⁻-type epitaxial sublayer 48 has an impurity density continuously varying from one surface to the other thereof and averaging, for example, $1E16$ atoms/cm$^{-3}$ when boron is used as the dopant. Also, the intermediate p⁺-type epitaxial sublayer 50 has an impurity density which continuously varies from one surface to the other thereof and which averages, for example, $5E16$ atoms/cm$^{-3}$ when boron is used as the dopant. In the stack of the sublayers 46, 50 and 48 formed by such a ramp epitaxial growth process, the impurity density adjacent of the interface between adjacent two of the individual sublayers is linearly graded from one sublayer to the other. The stage of the device fabrication process as shown in FIG. 11 is followed by the steps to form the n⁺-type layer region 30 as discussed in paragraph (c) regarding the fabrication process illustrated in FIGS. 7A to 7E.

Figure 12:
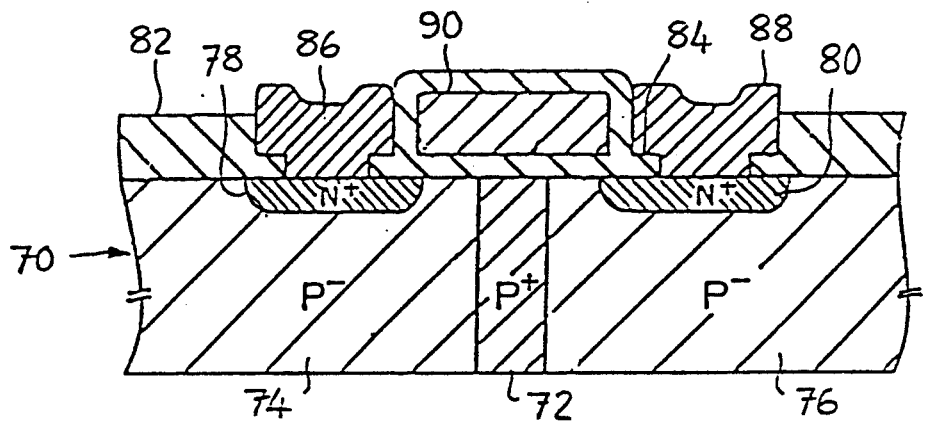
FIG. 12 is a fragmentary cross sectional view showing a preferred planar-type an insulated-gate field-effect transistor device embodying the present invention.
Figure 13:
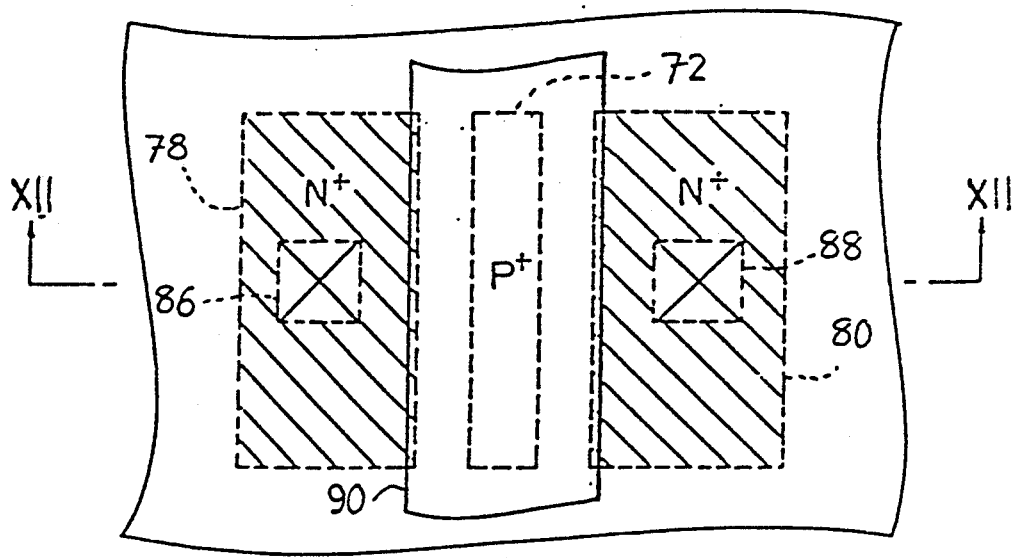
FIG. 13 is a plan view of the semiconductor structure shown in FIG. 12, the cross section of FIG. 12 being taken along line I—I in FIG. 4.

While it has been assumed that the present invention is to be applied to an insulated-gate field-effect transistor device of the vertical or trench-type, the gist of the invention is also applicable to an insulated-gate field-effect transistor device of the planar type. FIGS. 12 and 13 shows a preferred embodiment of such a planar-type insulated-gate field-effect transistor.

Referring to FIGS. 12 and 13, such a planar-type insulated-gate field-effect transistor is shown comprising a p⁻-type silicon layer 70. The silicon layer 70 is lightly doped with an acceptor-type dopant such as boron to a density of, for example, $1E10^{16}$ and may be provided either in the form of a p⁻-type silicon substrate or in the form of an epitaxial layer grown on an n silicon substrate. The silicon layer 70 has formed therein a heavily doped p⁺-type region 72 extending throughout the thickness of the silicon layer 70 and forming two lightly doped p⁻-type regions 74 and 76 spaced apart from each other across the p⁺-type region 72. The silicon layer 70 further has therein two relatively shallow, heavily doped n⁺-type regions 78 and 80 which are formed in the p⁻-type regions 74 and 76, respectively, and are spaced apart from the region 72 along the surface of the silicon layer 70 to leave portions of the p$^-$-type regions 74 and 76 between the p$^+$-type region 72 and the n$^+$-type regions 78 and 82 as shown. The p$^+$-type region 72 thus intervening between the p$^-$-type regions 74 and 76 and between the n$^+$-type regions 78 and 80 along the surface of the layer 70 may be formed by ion implantation or diffusion of an acceptor-type dopant such as boron to a density of, for example, $5E10^{16}$. The n$^+$-type regions 78 and 80 may be formed by diffusion of a donor-type dopant such as phosphorus and provides source/drain regions in the shown planar-type insulated-gate field-effect transistor. On the surface of the silicon layer 70 are formed a relatively thick field oxide layer 82 and a gate oxide film 84 which are patterned to form contact holes through which source/drain electrodes 86 and 88 extend for contact with the n$^+$-type source/drain regions 78 and 80, respectively. The gate oxide film 84 has provided thereon a gate electrode 90 of, for example, doped polysilicon. The planar-type transistor thus constructed can be fabricated using a standard process for the fabrication of MOS field-effect transistors with an additional step required to form the p$^+$-type region 72 in the silicon layer 70 at an initial stage of the process. In the description to follow, it will be assumed by way of example that the n$^+$-type region 78 is to be used as the source and the n$^+$-type region 80 as the drain.

It will be seen that the configuration of the planar MOS field-effect transistor structure hereinbefore described with reference to FIGS. 12 and 13 is essentially similar to that of the trench-type device of FIGS. 3 and 4. Each of the device structures includes three adjacent regions which partake of a like conductivity type and one of which is higher in impurity density than the others and intervenes between the other two. In the presence of a voltage of ground level at the gate electrode 90, the planar field-effect transistor device shown in FIGS. 12 and 13 has an inversion state established in the lightly doped p$^-$-type source region 74, a weak inversion state established in the heavily doped p$^+$-type region 72 and a depletion state established in the lightly doped p$^-$-type region 76. When a gate voltage is applied under such a condition, a current is passed between the source and drain regions 78 and 80 under the control of the heavily doped p$^+$-type region 72 which thus acts to set a certain threshold voltage depending upon the applied gate voltage. To enable the heavily doped p$^+$-type region 72 to control the current between the source and drain regions 78 and 80, it is required that the particular region 72 have a certain ample cross sectional area with respect to the source and drain regions 78 and 80. If, in addition, the p$^+$-type region 72 is located closer to the source region 78 than to the drain region 80, there will result a higher threshold voltage and if, conversely, the p$^+$-type region 72 is located closer to the drain region 80 than to the source region 78, then either there will result either a lower threshold voltage or more likelihood of a punch-through occurring. It is for these reasons important that the geometries of the heavily doped p$^+$-type region 72 with respect to the source and drain regions 78 and 80 be selected by meticulous, just design consideration.

That the heavily doped p$^+$-type region 72 extends throughout the thickness of the p-type silicon layer 70 in the embodiment of FIGS. 12 and 13 is of importance since such a region prevents a current from flowing through the layer 70 across the particular region 72. The current through the device can therefore be controlled only in the surface region of the layer 70, thus providing ease of control over the current. It is to be however noted that, insofar as there would be no serious adverse affects invited, the depth to which the heavily doped p$^+$-type region 72 extends through the p$^-$-type silicon layer 70 may be varied so that the region 72 terminates within the layer 70.

While some preferred embodiments of an insulated-gate field-effect transistor device according to the present invention and a few preferred examples of the process of fabricating such a device have thus far been described and shown, it should be borne in mind that such embodiments and examples are merely for the purpose of illustration of the gist of the present invention and are, accordingly, subject modification and change if desired or where necessary. While, for example, the heavily doped p$^+$-type region or sublayer forming part of the channel region of the device has been assumed to be utilized for the control of the threshold voltage, the same region or sublayer may be used also for enabling the device to control the punch-through current if the particular region is designed to have a reduced measurement between the source and drain regions. It should also be noted that the impurity densities which have been specified for the lightly doped and heavily doped p$^-$-type regions or sublayers forming the channel region are simply by way of example and may be varied depending upon the applications for which the device is to be used. It should be further understood that the conductivity types which have been allocated to the different layers, sublayers and regions of each of the embodiments described are also merely by way of example and, for this reason, may be reversed where desired.

As will have been understood from the foregoing description, an insulated-gate field-effect transistor device according to the present invention incorporated a channel region comprising at least three portions: an intermediate heavily doped portion (50; 72) and two lightly doped portions (46,48; 74,76) provided on both sides of the heavily doped portion. Such a field-effect transistor device is advantageous firstly in that it provides a surface potential locally increased to act as an energy barrier to minority carriers. This permits control over the threshold voltage of a MOS transistor or over the punch-through current of a punch-through transistor without having recourse to the use of a high carrier density throughout the channel region. The carrier density of the channel region being rather reduced, not only reduction in leakage current but improvement in breakdown voltage characteristics can be achieved in a device according to the present invention. A device according to the present invention is further advantageous for its reliability of operation which would otherwise be impaired by spurious actions of parasitic device elements other than the proper actions of the device per se.

What is claimed is:

1. A semiconductor memory structure comprising:
   a semiconductor body overlaid by vertically arranged first, second and third semiconductor layers of a first conductivity type, the third layer having a higher dopant level than and located between the first and second layers;
   a fourth semiconductor layer of a second conductivity type interposed between the first semiconductor layer and the semiconductor body;

a plurality of spaced conductive regions extending through each of the first, second and third semiconductor layers and a plurality of layers of insulating material respectively isolating each of said conductive regions from said first, second and third layers;

a pair of regions of said second conductivity type in the second semiconductor layer located on opposite sides of each of said conductive regions;

each said conductive region defining the gate electrode of a pair of field effect transistors having gate insulators defined by the layer of insulating material for that conductive region, drain regions provided respectively by the pair of regions of second conductivity type located on opposite sides of that conductive region, a source region common to all of said pairs of transistors provided by said fourth semiconductor layer and a channel region provided by said first, second and third semiconductor layers extending between said source and drain regions, said third semiconductor layer having a thickness as measured along the extent of the channel region significantly less than that of at least one of said first and second semiconductor layers and in response to a gate voltage applied to said gate electrode, said third semiconductor layer initially changing from a depletion state to a weak inversion state and subsequently to a strong inversion state, said weak inversion state supporting limited source-drain current flow determined by said gate voltage;

a plurality of word lines connected to conductive regions of respective transistors arranged in one transistor group of a row transistor group and a column transistor group; and a plurality of bit lines optionally connected to drain regions of respective transistors arranged in the other transistor group.

2. A semiconductor memory structure as set forth in claim 1, wherein said first conductivity type is P-type and said second conductivity type is N-type.

3. A semiconductor memory structure as set forth in claim 2, wherein said pairs of regions and said fourth semiconductor layer are heavily doped N-type.

4. A semiconductor memory structure as set forth in claim 2, wherein said semiconductor body is p-type conductivity.

5. A semiconductor memory structure as set forth in claim 1, wherein said conductive regions comprise doped semiconductor material.

6. A semiconductor memory structure as set forth in claim 1, wherein said layers of insulating material comprise silicon oxide.

7. A semiconductor memory structure as set forth in claim 1, wherein said semiconductor body and said first, second, third and fourth semiconductor layers comprise silicon, said conductive regions comprise doped polysilicon, and said layers of insulating material comprise silicon oxide.

8. A semiconductor integrated circuit structure comprising:

a semiconductor body overlaid by a first semiconductor layer of one conductivity type having a surface insulating layer;

a first semiconductor region of opposite conductivity type interposed between the first semiconductor layer and the semiconductor body;

a plurality of spaced conductive regions extending through said surface insulating layer and said first semiconductor layer to said first semiconductor region, each said conductive region isolated from said first semiconductor layer and said first semiconductor region by a layer of insulating material;

a pair of second regions of said opposite conductivity type in the first semiconductor layer located on opposite sides of each of said conductive regions adjacent to said surface insulating layer;

each said conductive region defining the gate electrode of a pair of field effect transistors having gate insulators defined by the layer of insulating material for that conductive region, drain regions provided respectively by the pair of second regions located on opposite sides of that conductive region, a source region common to all of said pairs of transistors provided by said first semiconductor region and channel regions provided by the first semiconductor layer extending between said source and drain regions;

a pair of third semiconductor regions of said one conductivity type in said first semiconductor layer extending on opposite sides of each said conductive region such that the channel region of each transistor comprises first and second sublayers of said first semiconductor layer separated by a said third region extending between said source and drain regions; each said third semiconductor region having a dopant level that is higher than that of said first and second sublayers and a thickness as measured along the extent of the channel region significantly less than that of at least one of said first and second sublayers such that in response to a gate voltage applied to said gate electrode, said third region initially changes from a depletion state to a weak inversion state and subsequently to a strong inversion state, said weak inversion state supporting limited source-drain current flow determined by said gate voltage.

9. A semiconductor integrated circuit structure as set forth in claim 8, wherein a continuous semiconductor region of said one conductivity type is disposed between but insulated from one of said conductive regions and an adjacent conductive region and provides one of the said pair of third semiconductor regions for each of those conductive regions.

10. A semiconductor integrated circuit structure as set forth in claim 8, including a contact region extending through said first semiconductor layer to said first semiconductor region to provide a common source contact region for said transistors, and a conductive contact extending through said surface insulating layer to said contact region; and respective conductive contacts extending through said surface insulating layer to said second semiconductor regions.

11. An insulated-gate field-effect transistor comprising:

semiconductor substrate means including a layer of semiconductor material of one conductivity type and an epitaxial layer of semiconductor material of the other conductivity type disposed on said semiconductor layer of said one conductivity type;

said epitaxial semiconductor layer of the other conductivity type being provided with a vertical trench extending therethrough;

said vertical trench extending partially into said semiconductor layer of said one conductivity type and bottoming therein;

a linear of insulation material covering the portions of said epitaxial semiconductor layer of the other conductivity type and said semiconductor layer of said one conductivity type defining the boundary of said vertical trench and providing an insulation liner for said vertical trench;

a region of said one conductivity type disposed in said epitaxial semiconductor layer of the other conductivity type and opening onto the top surface thereof adjacent to said insulation liner at the top portion of said vertical trench and serving as a drain region;

said semiconductor layer of said one conductivity type serving as a source region vertically spaced from the drain region provided by said region of said one conductivity type by said epitaxial semiconductor layer of the other conductivity type;

an electrically conductive material at least partially filling said vertical trench and disposed along the side walls of said trench in juxtaposition with said insulation liner;

said electrically conductive material within said trench serving as a gate electrode and the portion of said insulation liner between said gate electrode and said epitaxial semiconductor layer of the other conductivity type serving as a gate insulation layer;

said epitaxial semiconductor layer of the other conductivity type serving as a channel region extending vertically between said drain region and said source region of said one conductivity type; and said channel region defined by said epitaxial semiconductor layer of the other conductivity type comprising at least three portions including first, second and third portions of the other conductivity type;

the third portion of said channel region having a higher dopant level than the first and second portions of said channel region and located therebetween;

said first, third and second portions being in contact with each other with said first portion in contact with said source region and with said second portion in contact with said drain region, each of said first, third and second portions having two substantially parallel surfaces extending transversely of the direction of extent between said source and drain regions, the dopant levels of each of the first, third and second portions varying continuously from one of said surfaces to the other, the adjoining transversely extending surfaces between said first and third portions and between said third and second portions defining respective interfaces, and the dopant level adjacent each of the interfaces being substantially linearly graded from one of the two adjoining portions to the other; and said third portion of said channel region having a vertical thickness significantly less than at least one of the first and second portions of said channel region, and said third portion of said channel region initially being in a depletion state and being responsive to a gate voltage applied to said gate electrode to change to a weak inversion state and subsequently to a strong inversion state, said third portion of said channel region in its weak inversion state supporting limited source-drain region current flow as determined by said gate voltage.

12. A semiconductor integrated circuit structure comprising:

semiconductor substrate means including a layer of semiconductor material of one conductivity type and an epitaxial layer of semiconductor material of the other conductivity type disposed on said semiconductor layer of said one conductivity type;

said epitaxial semiconductor layer of the other conductivity type being provided with a plurality of vertical trenches extending therethrough and disposed in spaced relation with respect to each other;

each of said vertical trenches extending partially into said semiconductor layer of said one conductivity type and bottoming therein;

a linear of insulation material covering the portions of said epitaxial semiconductor layer of the other conductivity type and said semiconductor layer of said one conductivity type defining the boundary of each of said vertical trenches to provide respective insulation liners for each of said vertical trenches;

respective pairs of regions of said one conductivity type disposed in said epitaxial semiconductor layer of said other conductivity type and opening onto the top surface thereof adjacent to said insulation liner at the top of each of said vertical trenches and serving as drain regions, one of said regions of each pair of regions of said one conductivity type being disposed on one side of the vertical trench corresponding thereto and the other region of teach pair of regions being disposed on the opposite side of the vertical trench corresponding thereto;

said semiconductor layer of said one conductivity type serving as a source region common to all of said drain regions and vertically spaced therefrom;

an electrically conductive material at least partially filling each of said vertical trenches and disposed along the side walls of each said trench in juxtaposition with said insulation liner thereof;

said electrically conductive material within each of said trenches serving as a gate electrode and the portion of said insulation liner between said gate electrode and said epitaxial semiconductor layer of the other conductivity type on opposite sides of each trench serving as a gate insulation layer;

said epitaxial semiconductor layer of the other conductivity type serving as a vertically extending channel region between each of said drain regions and said source region of said one conductivity type, thereby defining respective pairs of transistors vertically arranged on opposite sides of each of said vertical trenches; and said epitaxial semiconductor layer of the other conductivity type comprising at least three portions of the channel region defined thereby for each transistor including first, second and third channel region portions of the other conductivity type;

the third portion of the channel region having a higher dopant level than the first and second channel region portions and located therebetween, said first, third and second channel region portions being in contact with each other said first channel region portion in contact with said source region and with said second channel region portion in contact with said drain region, each of said first, third and second channel region portions having two substantially parallel surfaces extending transversely of the direction of said channel region, the dopant level of each of the first, third and second channel region portions varying continuously from one of said surfaces to the other, the adjoining transversely extending surfaces between said first and third channel region portions defining respective third and second channel region portions defining respective interfaces, and the dopant level adjacent each of the interfaces being substantially linearly graded from one of the two adjoining channel region portions to the other, said third channel region portion having a vertical thickness significantly less than at least one of the first and second channel region portions, and said third channel region portion initially being in a depletion state and being responsive to a gate voltage applied to said gate electrode corresponding thereto to change to a weak inversion state and subsequently to a strong inversion state, said third channel region portion in its weak inversion state supporting limited source-drain region current flow as determined by said gate voltage as applied to said gate electrode of a corresponding transistor.

13. An insulated-gate field-effect transistor comprising:

a source region of a first conductivity type;

a drain region of the first conductivity type;

an intermediate region of a second conductivity type opposite said first conductivity type, the intermediate region extending between said source region and said drain region and providing a channel region for said transistor;

a gate electrode extending along and separated from said channel region by insulating material;

said intermediate region along its direction of extent from the source region to the drain region having at least three portions which comprise first, second and third portions of said second conductivity type, the third portion having a higher dopant level than and located between the first and second portions;

said first, third and second portions being in contact with each other with said first portion in contact with said source region;

each of said first, third and second portions having two substantially parallel surfaces extending transversely of the direction of extent between said source and drain regions, the dopant levels of each of the first, third and second portions varying continuously from one of said surfaces to the other; and said third portion having a thickness as measured along the extent of the channel region as provided by said intermediate region of said second conductivity type significantly less than at least one of the first and second portions, and in response to a gate voltage applied to said gate electrode, said third portion initially changing from a depletion state to a weak inversion state and subsequently to a strong inversion state, said weak inversion state supporting limited source-drain current flow determined by said gate voltage.

14. An insulated-gate field-effect transistor as set forth in claim 13, wherein the adjoining transversely extending surfaces between said first and third portions and between said third and second portions define respective interfaces, and the dopant level adjacent each of the interfaces being substantially linearly graded from one of the two adjoining portions to the other.

15. An insulated-gate field-effect transistor comprising:

a first semiconductor layer of a first conductivity type;

a second semiconductor layer of a second conductivity type opposite to the first conductivity type and disposed on said first semiconductor layer of the first conductivity type, the second semiconductor layer comprising at least first, second and third vertically arranged sublayers, the third sublayer being located between the first and second sublayers and having a higher dopant level than each of the first and second sublayers;

a semiconductor region in the second sublayer of the second semiconductor layer, the semiconductor region being of the first conductivity type;

said first, third and second sublayers extending in a direction between said first semiconductor layer and said semiconductor region to provide a channel region for said transistor;

said first, third and second sublayers being in contact with each other with said first sublayer being in contact with said first semiconductor layer and with said second sublayer being in contact with said semiconductor region;

each of said first, third and second sublayers having two substantially parallel surfaces extending transversely of the direction of said channel region, the dopant level of each of the first, third and second sublayers varying continuously from one of said surfaces to the other;

a gate electrode extending along and separated from the channel region by insulating material; and said third sublayer having a thickness as measured along the extent of the channel region that is substantially less than that of at least one of said first and second sublayers, and in response to a gate voltage applied to said gate electrode, said third sublayer initially changing from a depletion state to a weak inversion state and subsequently to a strong inversion state, said weak inversion state supporting limited source-drain current flow determined by said gate voltage.

16. An insulated-gate field-effect transistor as set forth in claim 15, wherein the adjoining transversely extending surfaces between said first and third sublayers and between said third and second sublayers define respective interfaces, and the dopant level adjacent each of the interfaces being substantially linearly graded from one of the two adjoining sublayers to the other.

17. An insulated-gate field-effect transistor comprising:

a semiconductor layer of a first conductivity type;

first, second, third, fourth and fifth semiconductor regions in said semiconductor layer and vertically arranged with respect to each other;

the first semiconductor region being of said first conductivity type and having a higher dopant level than said semiconductor layer;

said first, second and third semiconductor regions extending in a direction between said fourth and fifth semiconductor regions to provide a channel region for said transistor, the second and third semiconductor regions being spaced apart from each other by said first semiconductor region, each of the second and third semiconductor regions being of said first conductivity type and having a lower dopant level than said first semiconductor region;

said fourth and fifth semiconductor regions being spaced apart from each other by said first, second and third semiconductor regions, each of the fourth and fifth semiconductor regions being of a second conductivity type;

said first, second and third semiconductor regions being in contact with each other, with said second semiconductor region being in contact with said fourth semiconductor region and with said third semiconductor region being in contact with said fifth semiconductor region;

each of said first, second and third semiconductor regions having two substantially parallel surfaces extending transversely of the direction of said channel region, the dopant level of each of the first, second and third semiconductor regions varying continuously from one of said surfaces to the other;

a gate electrode extending along and separated from said channel region by gate insulating material; and said first semiconductor region having a thickness as measured along the extent of the channel region that is significantly less than that of at least one of said second and third semiconductor regions, and in response to a gate voltage applied to said gate electrode, said first semiconductor region initially changing from a depletion state to a weak inversion state and subsequently to a strong inversion state, said weak inversion state supporting limited source-drain current flow determined by said gate voltage.

* * * * *